(12) United States Patent
Lee et al.

(10) Patent No.: US 10,304,388 B2
(45) Date of Patent: May 28, 2019

(54) ORGANIC LIGHT EMITTING DISPLAY DEVICE

(71) Applicant: Samsung Display Co., Ltd., Yongin-Si, Gyeonggi-Do (KR)

(72) Inventors: Jeongho Lee, Seoul (KR); Dong-Hyun Lee, Suwon-si (KR); Yanghee Kim, Yongin-si (KR); Juncheol Shin, Asan-si (KR); Hokyoon Kwon, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/824,268

(22) Filed: Nov. 28, 2017

(65) Prior Publication Data

US 2018/0277040 A1    Sep. 27, 2018

(30) Foreign Application Priority Data

Mar. 27, 2017 (KR) .......................... 10-2017-0038440

(51) Int. Cl.
*G09G 3/32* (2016.01)
*G09G 3/3258* (2016.01)
*H01L 51/52* (2006.01)

(52) U.S. Cl.
CPC ....... *G09G 3/3258* (2013.01); *H01L 51/5203* (2013.01); *H01L 51/5237* (2013.01); *G09G 2310/0264* (2013.01); *G09G 2380/02* (2013.01)

(58) Field of Classification Search
CPC combination set(s) only.
See application file for complete search history.

(56) References Cited

U.S. PATENT DOCUMENTS

| | | | |
|---|---|---|---|
| 10,002,847 B2* | 6/2018 | Liu | H01L 27/32 |
| 2014/0186978 A1* | 7/2014 | Kang | H01L 27/3246 |
| | | | 438/23 |
| 2015/0060820 A1* | 3/2015 | Takagi | H01L 51/5218 |
| | | | 257/40 |
| 2018/0158887 A1* | 6/2018 | Yun | H01L 51/5209 |
| 2018/0159076 A1* | 6/2018 | Yun | H01L 51/5253 |
| 2018/0197929 A1* | 7/2018 | Cho | H01L 27/3258 |
| 2018/0247988 A1* | 8/2018 | Lee | H01L 27/3248 |

FOREIGN PATENT DOCUMENTS

| KR | 1020100125502 A | 12/2010 |
|---|---|---|
| KR | 1020140088408 A | 7/2014 |
| KR | 101625291 B1 | 5/2016 |

* cited by examiner

*Primary Examiner* — Van N Chow
(74) *Attorney, Agent, or Firm* — Cantor Colburn LLP

(57) ABSTRACT

An organic light emitting display device includes a thin film transistor on a substrate including a display area having an inner light-emitting area and an outer light-emitting area and a peripheral area, a first conductive member connected to the thin film transistor, a first via insulation layer covering the first conductive member, a second conductive member on the first via insulation layer to overlap the outer light-emitting area and a part of the peripheral area, a second via insulation layer covering the second conductive member, a first electrode on the second via insulation layer to overlap the display area and a part of the peripheral area, an organic light emitting layer on the first electrode, and a second electrode on the organic light emitting layer. The second via insulation layer and the first electrode have a step structure between the inner and outer light-emitting areas.

20 Claims, 13 Drawing Sheets

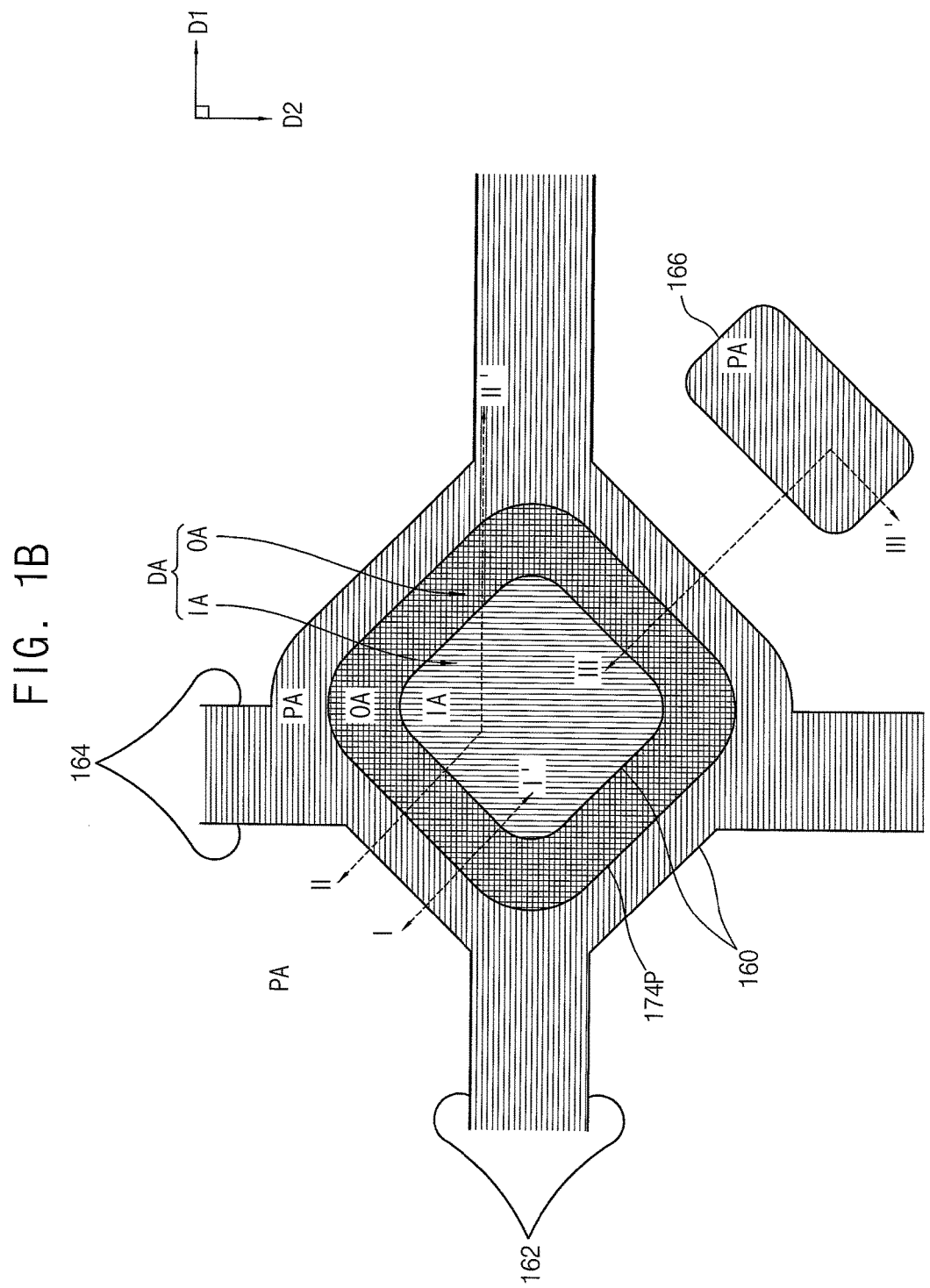

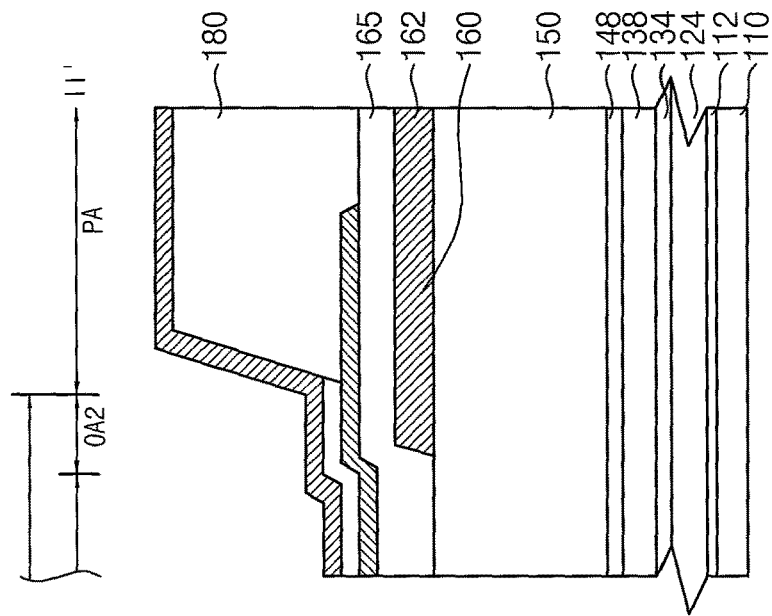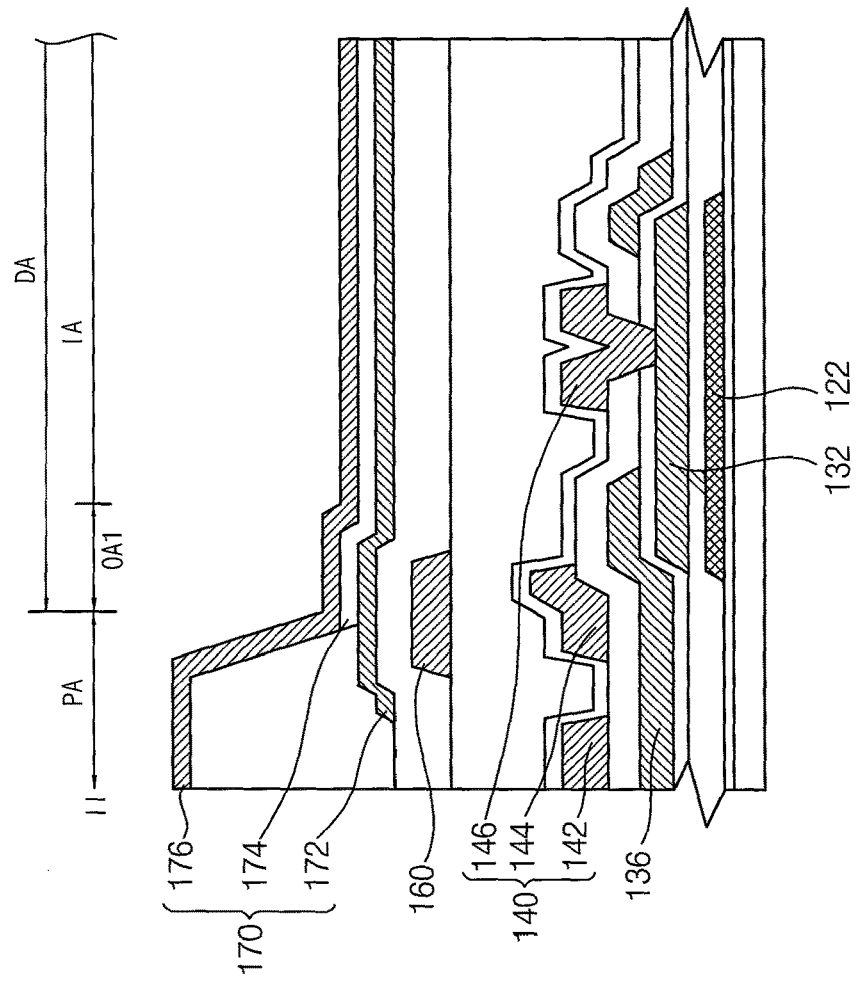
FIG. 8

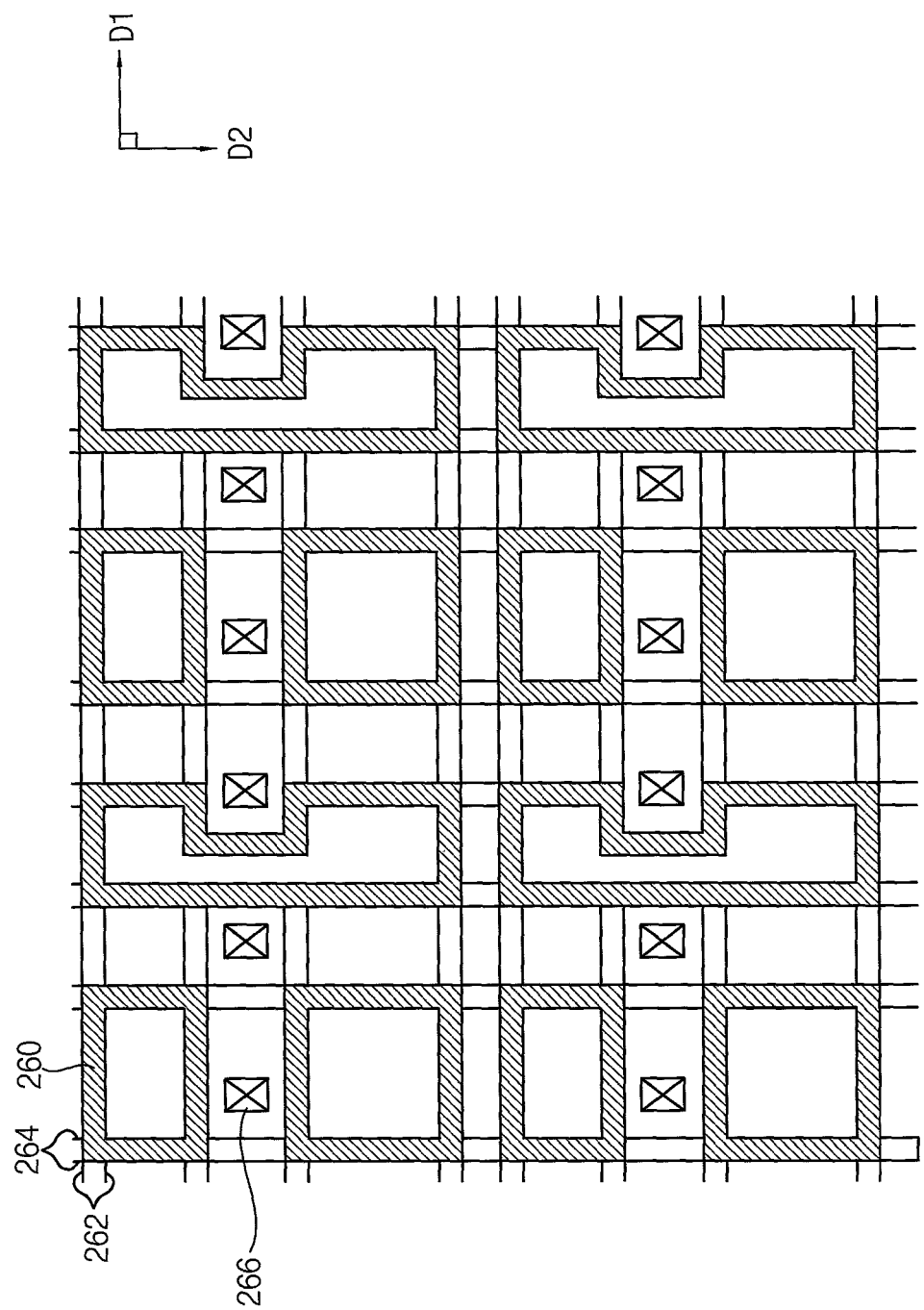

ORGANIC LIGHT EMITTING DISPLAY DEVICE

This application claims priority to Korean Patent Application No. 10-2017-0038440, filed on Mar. 27, 2017, and all the benefits accruing therefrom under 35 U.S.C. § 119, the content of which in its entirety is herein incorporated by reference.

BACKGROUND

1. Field

Exemplary embodiments of the invention relate to display devices. More particularly, exemplary embodiments of the invention relate to organic light emitting display device.

2. Discussion of Related Art

An organic light emitting display device typically includes two electrodes (e.g., anode and cathode) and an organic light emitting layer disposed therebetween. An electron injected from the cathode and a hole injected from the anode area may be combined to generate an exciton, and the exciton emits light while emitting energy.

The organic light emitting display device includes a plurality of pixels, each of which includes an organic light emitting diode ("OLED") including the cathode, the anode and the organic light emitting layer. In such an organic light emitting display device, each of the pixels may include a plurality of transistors and a capacitor to drive the organic light emitting diode. The transistors may include a switching transistor and a driving transistor.

In recent years, some conductive patterns included in a backplane structure are increasing to stably maintain a high driving voltage supply in accordance with the demand for high display luminance and high luminance uniformity.

SUMMARY

Exemplary embodiments provide an organic light emitting display device including a step structure in a light-emitting area (or a display area) of a pixel.

Exemplary embodiments provide an organic light emitting display device including a first electrode having a step structure between an inner light-emitting area and an outer light-emitting area.

According to an exemplary embodiment, an organic light emitting display device includes: a substrate on which a display area including an inner light-emitting area and an outer light-emitting area surrounding the inner light-emitting area, and a peripheral area surrounding the display area are defined, a plurality of thin film transistors on the substrate, a first conductive member connected to at least one of the thin film transistors, a first via insulation layer on the substrate to cover the first conductive member and the thin film transistors, a second conductive member on the first via insulation layer, where the second conductive member overlaps the outer light-emitting area and a part of the peripheral area of the first via insulation layer when viewed from a plan view in a thickness direction of the substrate, a second via insulation layer on the first via insulation layer to cover the second conductive member, a first electrode on the second via insulation layer, where the first electrode overlaps the outer light-emitting area and a part of the peripheral area of the second via insulation layer when viewed from the plan view, an organic light emitting layer on the first electrode in a pattern of the display area, and a second electrode on the organic light emitting layer. In such an embodiment, each of the second via insulation layer and the first electrode has a step structure between the inner light-emitting area and the outer light-emitting area.

In an exemplary embodiment, a height of a portion of the second via insulation layer in the outer light-emitting area may be greater than a height of a portion of the second via insulation layer in the inner light-emitting area, and a height of a portion of the first electrode in the outer light-emitting area may be greater than a height of a portion of the first electrode in the inner light-emitting area.

In an exemplary embodiment, a part of the first electrode and a part of the organic light emitting layer may overlap at least a part of the second conductive member in the outer light-emitting area.

In an exemplary embodiment, the organic light emitting display device may further comprise a passivation layer between the first conductive member and the first via insulation layer to cover the first conductive member and the thin film transistors.

In an exemplary embodiment, the passivation layer may include an inorganic material, and each of the first via insulation layer and the second via insulation layer may include an organic material.

In an exemplary embodiment, the second conductive member may include a border pattern arranged with a uniform width along a border line of the display area, a first extension pattern extending in a first direction in the peripheral area to electrically connect between adjacent border patterns in a same row, and a second extension pattern extending in a second direction perpendicular to the first direction in the peripheral area to electrically connect between adjacent border patterns in a same column.

In an exemplary embodiment, the second conductive member may further include a contact pattern spaced apart from the first extension pattern and the second extension pattern in the peripheral area to be electrically connected to the first electrode through the at least one of the thin film transistors.

In an exemplary embodiment, a planar shape of the contact pattern when viewed from the plan view may be a rectangular shape having sides not parallel to both the first direction and the second direction.

In an exemplary embodiment, a first thickness, which is a thickness of the portion of the second via insulation layer in the outer light-emitting area, may be different from a second thickness, which is a thickness of the portion of the second via insulation layer in the inner insulation layer.

In an exemplary embodiment, the first thickness may be greater than the second thickness.

In an exemplary embodiment, the first thickness may be less than the second thickness.

In an exemplary embodiment, a first thickness, which is a thickness of the portion of the second via insulation layer in the outer light-emitting area, may be substantially the same as a second thickness, which is a thickness of the portion of the second via insulation layer in the inner insulation layer.

In an exemplary embodiment, the outer light-emitting area may be in a rim shape with a uniform width along a border line of the display area corresponding to an arrangement of the second conductive member.

In an exemplary embodiment, the first conductive member may include a data line pattern which transmits a data voltage, a driving voltage line pattern which transmits a driving voltage, a contact pattern electrically connected to the thin film transistors, the data line pattern, and the driving voltage line pattern.

In an exemplary embodiment, the second conductive member may transmit the driving voltage.

In an exemplary embodiment, at least a part of the second conductive member may overlap the driving voltage line pattern when viewed from the plan view.

According to an exemplary embodiment, an organic light emitting display device includes: a backplane substrate divided into a display area including an inner light-emitting area and an outer light-emitting area surrounding the inner light-emitting area, and a peripheral area surrounding the display area; a first electrode on the inner light-emitting area and the outer light emitting area of the second via insulation layer and a part of the peripheral area of the backplane substrate; an organic light emitting layer on the first electrode in a pattern of the display area; and a second electrode on the organic light emitting layer. In such an embodiment, the first electrode has a step structure between the inner light-emitting area and the outer light-emitting area, In an exemplary embodiment, the backplane substrate may include a substrate, a plurality of thin film transistors on the substrate, a first conductive member electrically connected to at least one of the thin film transistors, a first via insulation layer covering the first conductive member and the thin film transistors, a second conductive member on a portion of the first via insulation layer in the outer light-emitting area and a part of a portion the peripheral area of the first via insulation layer in the peripheral area, and a second via insulation layer on the first via insulation layer to cover the second conductive member, where the second via insulation layer has a step structure between the inner light-emitting area and the outer light-emitting area.

In an exemplary embodiment, a height of a portion of the second via insulation layer in the outer light-emitting area may be greater than a height of a portion of the second via insulation layer in the inner light-emitting area, and a height of a portion of the first electrode in the outer light-emitting area may be greater than a height of a portion of the first electrode in the inner light-emitting area.

In an exemplary embodiment, the second conductive member may include a border pattern arranged with a uniform width along a border line of the display area.

According to an exemplary embodiment, the organic light emitting display device includes the outer light-emitting area having a height difference with respect to the inner light-emitting area. Thus, in such an embodiment, the light emitted (or reflected) from the display area (i.e., the first electrode) may change with substantially uniform angle in accordance with viewing angle, and the color shift or white angular dependency ("WAD") characteristic may be improved to be uniform. Therefore, the side visibility of the user may be improved.

BRIEF DESCRIPTION OF THE DRAWINGS

The above and other features of the invention will become more apparent by describing in further detail exemplary embodiments thereof with reference to the accompanying drawings, in which:

FIG. 1B is an enlarged schematic plan view illustrating a part of the organic light emitting display device of FIG. 1A;

FIG. 8 is a schematic cross-sectional view taken along line II-II' of FIG. 1B illustrating a portion of an exemplary embodiment of the organic light emitting display device.

FIG. 12 is a schematic plan view illustrating an arrangement of a second conductive member included in the organic light emitting display device of FIG. 11.

DETAILED DESCRIPTION

Figure 1A:
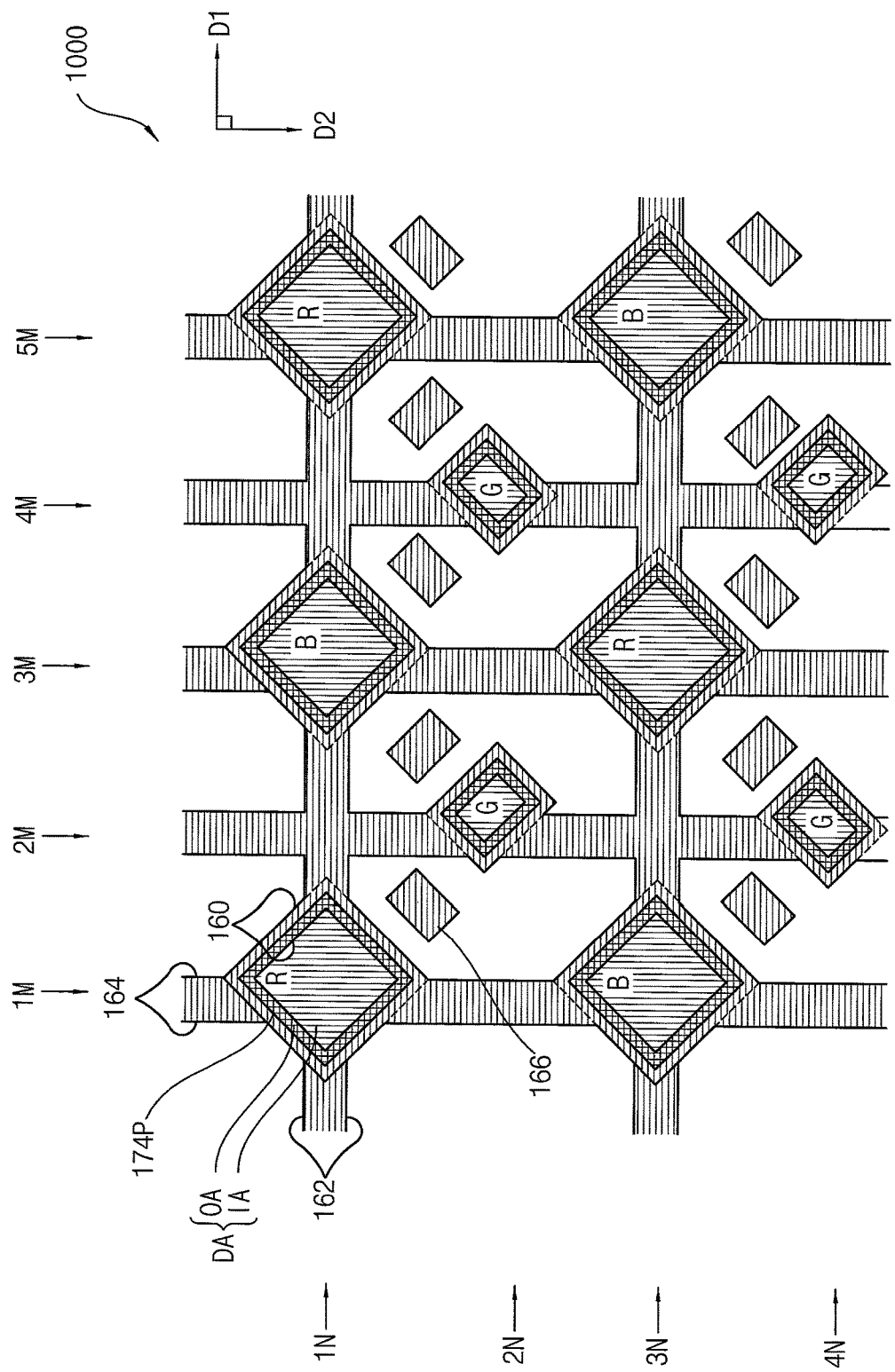
FIG. 1A is a schematic plan view of an organic light emitting display device according to an exemplary embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/ or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Exemplary embodiments of an organic light emitting display device according to the invention will be described more fully hereinafter with reference to the accompanying drawings, in which various embodiments are shown.

FIG. 1A is a schematic plan view of an organic light emitting display device according to an exemplary embodiment, and FIG. 1B is an enlarged schematic plan view illustrating a part of the organic light emitting display device of FIG. 1A.

Referring to FIGS. 1A and 1B, an exemplary embodiment of the organic light emitting display device 1000 may include a plurality signal lines (or conductive members) and a plurality of pixels R, G and B connected to the signal lines and arranged substantially in a matrix form.

The organic light emitting display device 1000 may be a flat display device, a flexible display device, a transparent display device or a curved display device, for example.

The organic light emitting display device 1000 may include a display area DA (a pattern of the display area), on which an image is displayed by an organic light emitting layer pattern 174P therein, and a peripheral area PA (a portion other than the display area DA) surrounding the display area DA.

The pixels R, G and B may include first to third pixels. In some embodiments, the first to third pixels may correspond to a red pixel R, a green pixel G and a blue pixel B, respectively.

In an exemplary embodiment, as illustrated in FIG. 1A, the red pixels R and the blue pixels B may be arranged alternately in a first direction D1 in a first row 1N, and the green pixels G may be arranged and spaced apart from each other in the first direction D1 in a second row 2N adjacent to the first row 1N. In such an embodiment, the red pixels R and the blue pixels B may be arranged alternately in the first direction D1 in a third row 3N, and the green pixels G may be arranged and spaced apart from each other in the first direction D1 in a fourth row 4N. Such pixel arrangement may be repeated up to predetermined rows.

The green pixels G in the second row 2N may be staggered with the red pixels R and the blue pixels B. Thus, the red pixels R and the blue pixels may be arranged alternately in a second direction D2 in a first column 1M, and the green pixels G may be arranged and spaced apart from each other in the second direction D2 in a second column 2M. Such pixel arrangement may be repeated up to predetermined columns. A size of each of the blue pixels B may be greater than those of the red and green pixels R and G.

Such a pixel arrangement structure may be referred to as a pentile matrix, and a rendering operation for expressing colors by sharing light emissions of adjacent pixels may be applied.

Although the pixels R, G and B in FIG. 1A area schematically shown in FIG. 1A as having a rectangular shape, the shapes of the pixels are not limited thereto.

Specifically, FIGS. 1A and 1B shows an arrangement of a conductive member (represented as 160, 162, 164 and 166 in FIGS. 1A and 1B) at a lower portion of a first electrode, and a planar arrangement relationship between the organic light emitting layer pattern 174P and the conductive member 160, 162, 164 and 166 in an exemplary embodiment. In one exemplary embodiment, for example, the red pixel R may emit red color light on a region where a red organic light emitting layer pattern. In some embodiments, an area where the organic light emitting layer pattern 174P is formed or occupies may correspond to the display area DA.

In some embodiments, the conductive member (including 160, 162, 164 and 166) may be a signal line for transmitting a driving voltage to the pixels R, G and B and/or a connection line for connecting thin film transistors included in the pixels R, G and B, organic light emitting diode (light emitting structures), or the like. The driving voltage may be a high potential voltage for driving the pixels R, G and B. The conductive member in FIGS. 1A and 1B may be substantially the same as a second conductive member to be described with reference to FIG. 2.

In some embodiments, as shown in FIG. 1B, the conductive member may include a border pattern 160 arranged with a uniform width along a border line of the display area DA (e.g., side boundaries of the organic light emitting layer pattern 174P). The border pattern 160 may be a rim shape surrounding the display area DA. A portion of the border pattern 160 may overlap a portion of the display area DA. The display area DA may be divided into an inner light-emitting area IA and an outer light-emitting area OA surrounding the inner light-emitting area IA based on the arrangement of the border pattern 160. In some embodiments, each of the border pattern 160 and the outer light-emitting area OA may have a uniform or constant width. The outer light-emitting area OA and the inner light-emitting area IA may have a step structure (or a level difference) with respect to the inner light-emitting area IA based on the border pattern 160. In some embodiments, the outer light-emitting area OA may protrude from the inner light-emitting area IA. In one exemplary embodiment, for example, the outer light-emitting area OA may protrude about 0.5 μm in a thickness direction from the inner light emitting area IA. Here, the thickness direction is a direction perpendicular to the first direction D1 and the second direction D2.

In some embodiments, the outer light-emitting area OA may be in a rim shape having a uniform inclination and a uniform height and surrounding the inner light-emitting area IA. Thus, an image may be visually recognized from the light emission of the protruding outer light-emitting area OA having substantially the same inclination and height from the inner light-emitting area IA regardless of the pixel in any direction.

A color shift may occur depending on the position and/or viewing angle of a user. Thus color shift is also called white angular dependency ("WAD"). When white color light is emitted from the display device, the white color light may be visible on the front side, but the color shift, such as greenish, bluish and reddish, may be visible on the other sides due to a wavelength shift by a light path differences.

In an exemplary embodiment, the display area may be divided into the outer light-emitting area OA having a uniform step with respect to the inner light-emitting area IA. Thus, in such an embodiment, the WAD characteristic that varies irregularly according to the viewing angle and the viewing position may be improved to be uniform due to the uniform step.

In an exemplary embodiment, as shown in FIG. 1A, the conductive member may further include a first extension pattern 162 extending in the first direction D1 in the peripheral area PA to electrically connect between adjacent border patterns 160 in the same row. In one exemplary embodiment, for example, the first extension pattern 162 may be arranged in odd rows (1N, 3N, . . . ). The first extension pattern 162 may transmit the driving voltage to the first direction D1 in the organic light emitting display device 1000.

In such an embodiment, the conductive member may further include a second extension pattern 164 extending in the second direction D2 perpendicular to the first direction D1 in the peripheral area PA to electrically connect between adjacent border patterns 160 in the same column. In one exemplary embodiment, for example, the second extension pattern 164 may be arranged in every column (1M, 2M, . . . ) to transmit the driving voltage in the second direction D2 in the organic light emitting display device 1000.

The first and second extension patterns 162 and 164 may performs substantially the same function as a driving voltage line pattern (144 in FIG. 2) that is disposed under the first and second extension patterns 162 and 164 to transmit the driving voltage to the pixels R, G and B. In such an embodiment, the first and second extension patterns 162 and 164 may reinforce the supply of the driving voltage to improve or eliminate luminance unevenness by the voltage drop of the driving voltage. In some embodiments, the first and second extension patterns 162 and 164 may overlap the driving voltage line pattern in the peripheral area PA.

The conductive member may further include a contact pattern 166. The contact pattern 166 may be spaced apart from the display area DA. The contact pattern 166 may be spaced apart from the first and second extension patterns 162 and 164 and disposed in the peripheral area PA. In some embodiments, the contact pattern 166 may electrically connect between the thin film transistor and the first electrode of the organic light emitting structure in the peripheral area PA of the pixel via a contact hole.

In some embodiments, a planar shape of the contact pattern 166 may be a rectangular shape having sides not parallel to both the first direction D1 and the second direction D2 when viewed from a plan view. Accordingly, a planar shape of a contact portion of the first electrode may be the rectangular shape having sides not parallel to both the first direction D1 and the second direction D2. However, the planar shape of the contact pattern 166 is not limited thereto. The planar shape of the contact pattern 166 may be a polygonal shape having sides not parallel to both the first direction D1 and the second direction D2.

In an exemplary embodiment, as described above, the organic light emitting display device 1000 may have the display area DA divided into the inner light-emitting area IA and the outer light-emitting area OA defining the uniform step structure with the inner light-emitting area IA. Thus, the emitted (or reflected) lights from the first electrode may change with a substantially uniform or constant angle, and the WAD characteristic that varies irregularly according to the viewing angle and the viewing position of the user may be improved to be uniform due to the uniform step structure.

Figure 2:
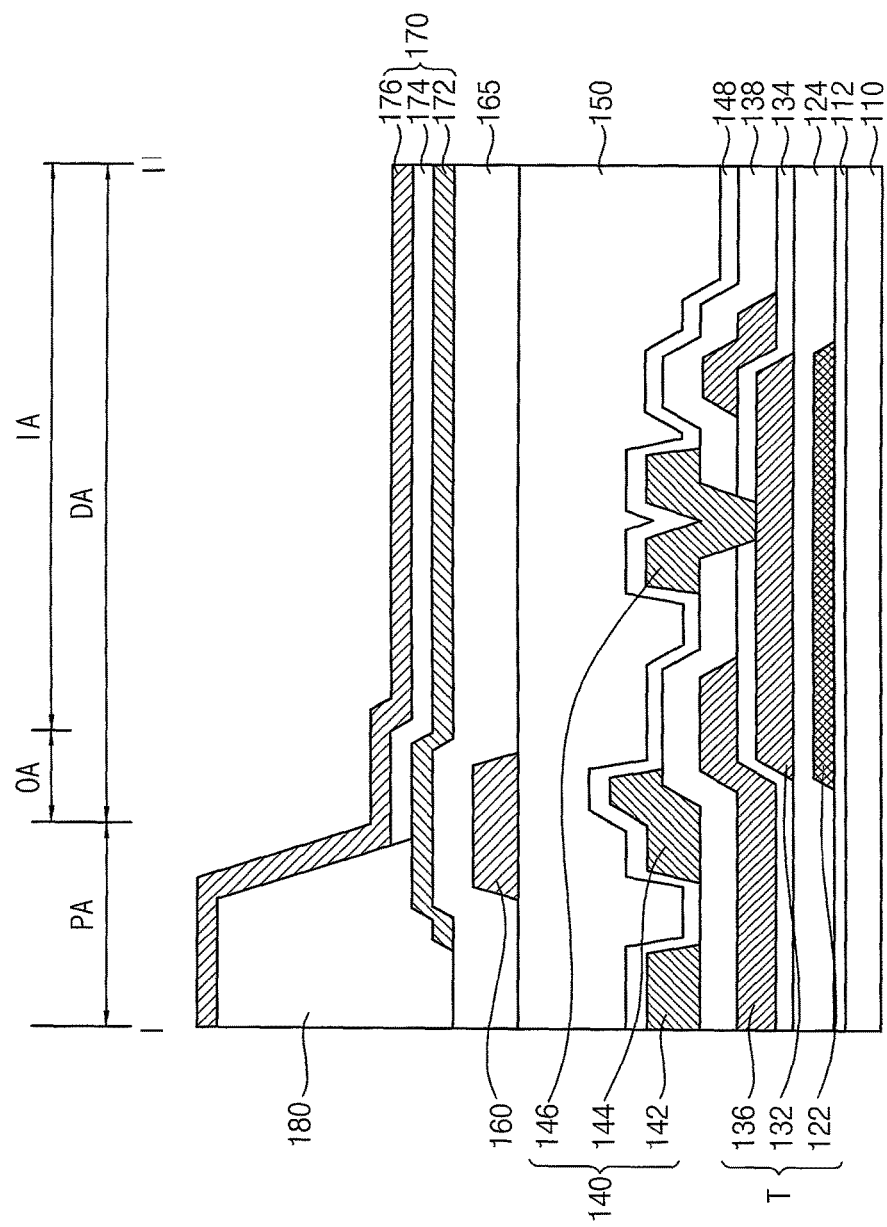
FIG. 2 is a schematic cross-sectional view taken along line I-I' of FIG. 1B illustrating a portion of an exemplary embodiment of the organic light emitting display device.

FIG. 2 is a schematic cross-sectional view taken along line I-I' of FIG. 1B illustrating a portion of an exemplary embodiment of the organic light emitting display device.

Referring to FIGS. 1B and 2, an exemplary embodiment of the organic light emitting display device 1000 may include: a backplane structure including a substrate 110, a plurality of thin film transistors T and a first conductive member 140; and a light emitting structure including a second conductive member 160, a first electrode 172, an organic light emitting layer 174 and a second electrode 176.

The organic light emitting display device 1000 (e.g., the substrate 110) may include a display area DA having an inner light-emitting area IA and an outer light-emitting area OA surrounding the inner light-emitting area IA, and a peripheral area PA surrounding the display area DA (i.e., surrounding the outer light-emitting area OA).

In some embodiments, an upper surface of the outer light-emitting area OA may be higher than an upper surface of the inner light-emitting area IA and the outer light-emitting area OA may protrude upwardly from the inner light-emitting area IA.

The substrate 110 may be a backplane substrate or a base substrate of the organic light emitting display device 1000. The substrate 110 may be a transparent insulation substrate such as a glass substrate, a quartz substrate, a transparent plastic substrate, and the like. In one exemplary embodiment, for example, the substrate 110 may include polymer materials having transparency and flexibility.

A buffer layer (or a barrier layer) 112 may be disposed on the substrate 110. The buffer layer 112 may effectively prevent diffusion of impurities from the substrate 110, and may adjust a heat transmit rate in a crystallization process for forming a semiconductor pattern. The buffer layer 112 may include a silicon compound, such as, for example, silicon oxide (SiOx), silicon nitride (SiNx), silicon oxynitride (SiOxNy), or the like. The buffer layer 112 may have a single-layered structure or a multi-layered structure including at least one silicon compound film.

The thin film transistors may be disposed on the buffer layer 112. Each of the thin film transistors may include an active layer, a gate insulation layer, a gate electrode, a source electrode and a drain electrode, for example. The thin film transistors may include a switching transistor and a driving transistor. The switching transistor may provide a data voltage from a data line to the pixel, and the driving transistor may receive the data voltage from the switching transistor and control amount of a driving current. In some embodiments, each pixel may include a pixel circuit structure having seven thin film transistors (a single driving transistor and six switching transistors) and a single storage capacitor.

In an exemplary embodiment, the active layer 122 may be disposed on the buffer layer 112. The active layer 122 may include an oxide semiconductor material, an inorganic semiconductor material (e.g., amorphous silicon, polysilicon, etc.) or an organic semiconductor material.

The gate insulation layer 124 may be disposed on the active layer 122. The gate insulation layer 124 may be disposed on the buffer layer 112 to cover the active layer 122. In some embodiments, the gate insulation layer 124 may have a substantially flat upper surface without forming a step structure around the active layer 122. In some embodiments, the gate insulation layer 124 may cover the active layer 122 on the buffer layer 112 and may be disposed along the profile of the active layer 122 to a uniform thickness. The gate insulation layer 124 may include a silicon oxide or a silicon nitride.

A first gate electrode 132 may be disposed on the gate insulation layer 124 overlapping the active layer 122. The first gate electrode 132 may include a metal, an alloy, a metal nitride, a conductive metal oxide, a transparent conductive material, or a combination thereof.

A first insulating interlayer 134 may be disposed on the first gate electrode 132. The first insulating interlayer 134 may be provided or formed on the gate insulation layer 124 to cover the first gate electrode 132. The first insulating interlayer 134 may include a silicon oxide, a silicon nitride, a silicon oxynitride, a metal oxide, or the like.

A second gate electrode 136 may be disposed on the first insulating interlayer 134. At least a part of the second gate electrode 136 may overlap at least a part of the first gate electrode 132. The second gate electrode 136 may include a metal, an alloy, a metal nitride, a conductive metal oxide, a transparent conductive material, or a combination thereof.

A second insulating interlayer 138 may be disposed on the second gate electrode 136. The second insulating interlayer 138 may be provided or formed on the first insulating interlayer 134 to cover the second gate electrode 136. The second insulating interlayer 138 may include a silicon oxide, a silicon nitride, a silicon oxynitride, a metal oxide, or the like.

In some embodiments, the source and drain electrodes (not illustrated) may be disposed on the second insulating inter layer 138. The source and drain electrodes may be connected to source and drain region of the active layer 122 via contact holes, respectively. Accordingly, the thin film transistor T may be defined by the active layer 122, the first gate electrode 132, the second gate electrode 136, the source electrode and the drain electrode.

The first conductive member 140 may be further disposed on the second insulating interlayer 138. The first conductive member 140 may be connected to the lower thin film transistor T and/or the upper light emitting structure 170 to transmit various voltages and signals. In some embodiments, the first conductive member 140 may include a data line pattern 142 for transmitting the data voltage, a driving voltage line pattern 144 for transmitting the driving voltage, and a connection pattern 146 (e.g., a bridge pattern) for connecting between the line patterns and the thin film transistors. In one exemplary embodiment, for example, the driving voltage line pattern 144 may overlap the first and second extension patterns 162 and 164 of FIG. 1B in the organic light emitting display device 1000. The first conductive member 140 may include a metal, an alloy, a metal nitride, conductive metal oxide, a transparent conductive material, or the like.

In some embodiments, a passivation layer 148 covering the first conductive member 140 and the thin film transistors T may be disposed on the second insulating interlayer 138. The passivation layer 148 may effectively prevent moisture and impurities from upper and lower portions. The passivation layer 148 may include an inorganic material. In one exemplary embodiment, for example, the passivation layer 148 may include a silicon compound, an alloy, or the like.

A first via insulation layer 150 may be disposed on the passivation layer 148. The first via insulation layer 150 may function as a planarization layer having a substantially planar upper surface. Thus, the upper surface of the first via insulation layer 150 may be substantially flat regardless of the location, shape, or the like of the underlying elements. The first via insulation layer 150 may include an organic material.

A second conductive member 160 may be disposed on the outer light-emitting area OA and a part of the peripheral area PA of the first via insulation layer 150. The second conductive member 160 may provide the driving voltage to the pixel. The second conductive member 160 may reinforce the supply of the driving voltage to improve the luminance unevenness due to the voltage drop of the driving voltage in the organic light emitting display device 1000. In an exemplary embodiment, the driving voltage is sufficiently supplied to the pixel through the driving voltage line pattern 144 and the second conductive member 160, so that the voltage drop and the luminance unevenness due to the voltage drop may be improved. The second conductive member 160 may be arranged to surround the entire outer light-emitting area OA of the display area DA with a uniform width as illustrated in FIGS. 1A and 1B. In some embodiments, the second conductive member 160 may overlap the driving voltage line pattern 144.

The second conductive member 160 may include a metal, an alloy, a metal nitride, a conductive metal oxide, a transparent conductive material, or the like. In one exemplary embodiment, for example, the second conductive member 160 may include at least one of gold (Au), silver (Ag), aluminum (Al), platinum (Pt), palladium (Pd), iridium (Ir), nickel (Ni), magnesium (Mg), calcium (Ca), lithium (Li), chromium (Cr), tantalum (Ta), molybdenum (Mo), Scandium (Sc), neodymium (Nd), aluminum alloys, aluminum nitride (AlNx), silver alloys, tungsten (W), tungsten nitride (WNx), copper alloys, molybdenum alloys, (TiNx), tantalum nitride (TaNx), strontium ruthenium oxide (SrRuxOy), zinc oxide (ZnOx), indium tin oxide ("ITO"), tin oxide (SnOx), indium oxide (InOx), gallium oxide Zinc oxide ("IZO"), and a combination thereof.

In some embodiments, the second conductive member 160 may further include the first extension pattern 162, the second extension pattern 164 and the contact pattern 166, which are described above with reference to FIGS. 1A and 1B.

A second via insulation layer 165 may be disposed on the first via insulation layer 150 to cover the second conductive member 160. The second via insulation layer 165 may form a step between the inner light-emitting area IA and the outer light-emitting area OA due to the second conductive member 160. In some embodiments, the second via insulation layer 165 may be formed with the step along a profile of the second conductive member 160. Accordingly, a height of a portion of the second via insulation layer 165 in the outer light-emitting area OA may be greater than a height of a portion of the second via insulation layer 165 in the inner light-emitting area IA. Here, a height of an element may be defined as a height of an upper surface thereof with respect to an upper surface of the substrate 110. In one exemplary embodiment, for example, the step or height difference may be about 0.5 micrometer (μm). However, in exemplary embodiments, the step or height difference is not limited thereto.

In some embodiments, a thickness of the second via insulation layer 165 in the outer light-emitting area OA may be different from a thickness of the second via insulation layer 165 in the inner light-emitting area IA. However, the second via insulation layer 165 may have a substantially uniform height (thickness) in the outer light-emitting area OA.

The first electrode 172 may be disposed on the inner and outer light-emitting areas IA and OA and a part of the peripheral area PA of the second via insulation layer 165. In an exemplary embodiment, a part of the first electrode 172 may overlap at least a part of the second conductive member 160 in the outer light-emitting area OA. The first electrode 172 may have a step structure between the inner light-emitting area IA and the outer light-emitting area OA along a side profile of the second via insulation layer 165. Thus, the height of a portion of the first electrode 172 in the outer light-emitting area OA may become greater than the height of a portion of the first electrode 172 in the inner light-emitting area IA. In some embodiments, the first electrode 172 may be an anode electrode of the light emitting structure 170. The first electrode 172 may be formed using a metal, an alloy, a metal nitride, a conductive metal oxide, a transparent conductive material, or a combination thereof.

A pixel defining layer 180 may be disposed on the peripheral area PA of the second via insulation layer 165 to expose a part of the first electrode 172. The pixel defining layer 180 may include or be formed of an organic material or an inorganic material.

The organic light emitting layer 174 may be disposed on the first electrode 172 exposed by the pixel defining layer 180. A part of the organic light emitting layer 174 may overlap at least a part of the second conductive member 160 in the outer light-emitting area OA. The display area DA may be determined by the organic light emitting layer 174 as illustrated in FIGS. 1A and 1B. The light emitting layer 174 may include at least one of organic light emitting materials capable of emitting different color lights (i.e., red color light, green color light, blue color light, and the like) according to pixels.

The second electrode 176 may be commonly disposed on the pixel defining layer 180 and the organic light emitting layer 174. In some embodiments, the second electrode 176 may be a cathode electrode of the light emitting structure 170. The second electrode 176 may be formed using a metal, an alloy, a metal nitride, a conductive metal oxide, a transparent conductive material, or a combination thereof. Accordingly, the light emitting structure 170 may be defined by the first electrode 172, the organic light emitting layer 174, and the second electrode 176. The light emitting structure 170 may have a step structure between the inner light-emitting area IA and the outer light-emitting area OA.

In such an embodiment, the second conductive member 160 and the second via insulation layer 165 having the step structure are disposed below the first electrode 172 for transmitting the driving voltage so that the display area DA may be divided into the inner light-emitting area IA and the outer light-emitting area OA having a uniform stepped portion with respect to the inner light-emitting area IA. Accordingly, the light emitted (or reflected) from the display area DA (i.e., the first electrode 172) may change with substantially uniform angle, and the color shift (or WAD) characteristic may be improved to be uniform. Therefore, in such an embodiment, the side visibility of the user may be improved.

Figure 3:
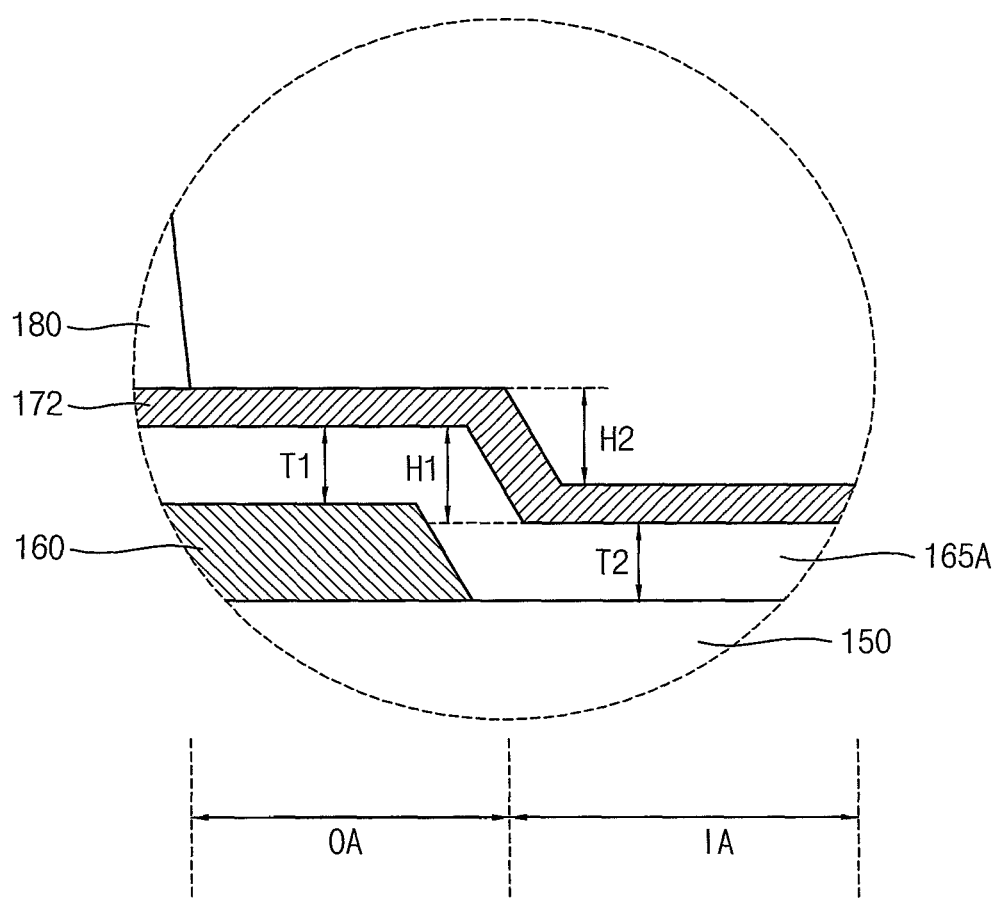
FIGS. 3 to 5 are schematic cross-sectional views illustrating a portion of exemplary embodiments of the organic light emitting display device.
Figure 4:
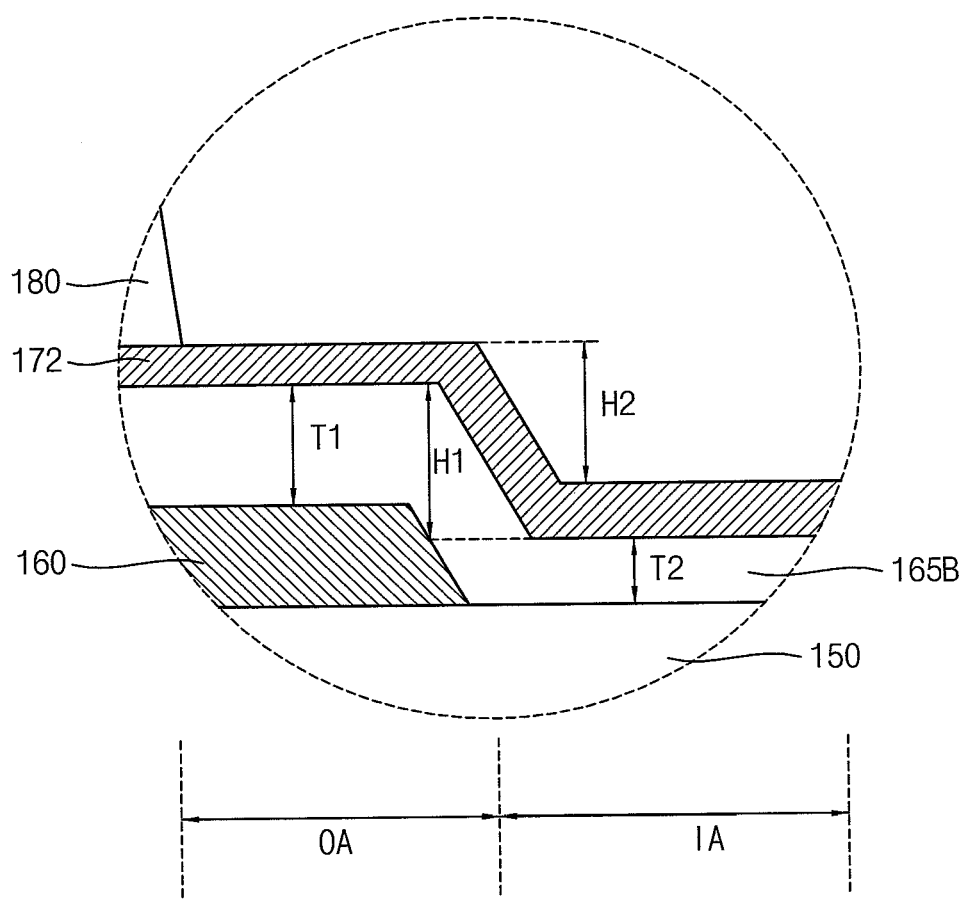
Figure 5:
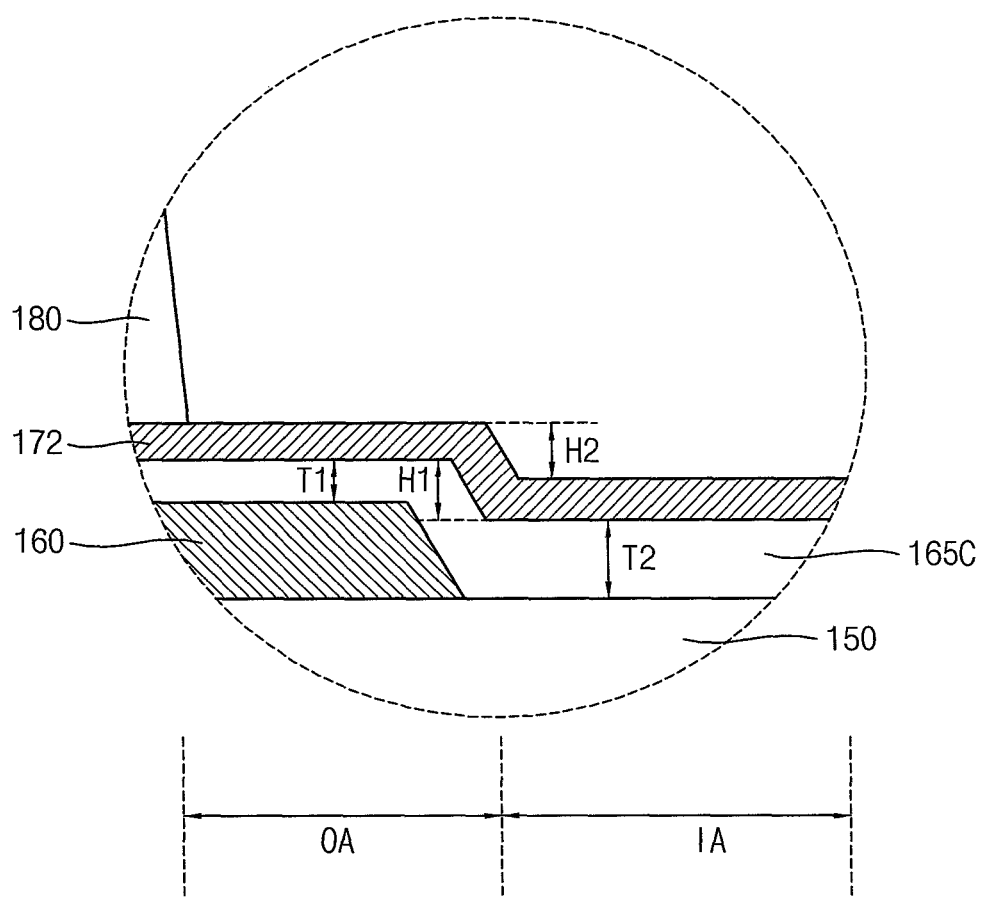

FIGS. 3 to 5 are enlarged schematic cross-sectional views illustrating a portion of exemplary embodiments of the organic light emitting display device.

Referring to FIGS. 3 to 5, in an exemplary embodiment, the second via insulation layer 165A, 165B or 165C may cover the second conductive member 160 and define a step structure between the inner light-emitting area IA and the outer light-emitting area OA.

The second via insulation layer 165A, 165B or 165C and the first electrode 172 may have steps (or height differences) H1 and H2 where the outer light-emitting area OA is higher than the inner light-emitting area IA. The second via insulation layer 165A, 165B and 165C may have a first thickness T1 in the outer light-emitting area OA and a second thickness T2 in the inner light-emitting area IA. The steps H1 and H2 for improving the color shift may be determined by adjusting the first thickness T1 and the second thickness T2. Here, the first thickness T1 may be a vertical distance between an upper surface of the second conductive member 160 and a lower surface of the first electrode 172 in the outer light-emitting area OA. The second thickness T2 may be a vertical distance between an upper surface of the second via insulating layer 165A, 165B and 165C and the lower surface of the first electrode 172 in the inner light-emitting area IA.

In such an embodiment, the thickness of the second via insulation layer 165A, 165B or 165C in the outer light-emitting area OA may be a thickness of the second via insulation layer 165A, 165B or 165C in a direction perpendicular to an upper surface of the second conductive member 160 in the outer light-emitting area OA. That is, the thickness of the second via insulation layer 165A, 165B or 165C in the inner light-emitting area IA may be a thickness of the second via insulation layer 165A, 165B or 165C in a direction perpendicular to an upper surface of the first via insulation layer 150 in the inner light-emitting area IA.

In some embodiments, as illustrated in FIG. 3, the first thickness T1 may be substantially the same as the second thickness T2. In such an embodiment, the second via insulation layer 165A may be formed with a uniform thickness, such that the process of forming the second via insulation layer 165A may be effectively simplified.

In some embodiments, the first thickness T1 may be different from the second thickness T2. In one exemplary embodiment, for example, as illustrated in FIG. 4, the first thickness T1 may be greater than the second thickness T2. In such an embodiment, the step H1 of the second via insulation layer 165B and the step H2 of the first electrode 172 may be increased as compared with the embodiment of FIG. 3.

In some embodiments, as illustrated in FIG. 5, the first thickness T1 may be less than the second thickness T2. In such an embodiment, the step H1 of the second via insulation layer 165C and the step H2 of the first electrode 172 may be decreased as compared with the embodiment of FIG. 3.

In some embodiments, the width of the outer light-emitting area OA may be substantially uniform throughout the display area DA.

Thus, in such embodiments, the color shift phenomenon through side view may be improved in a uniform direction and uniform wavelength.

Figure 6:
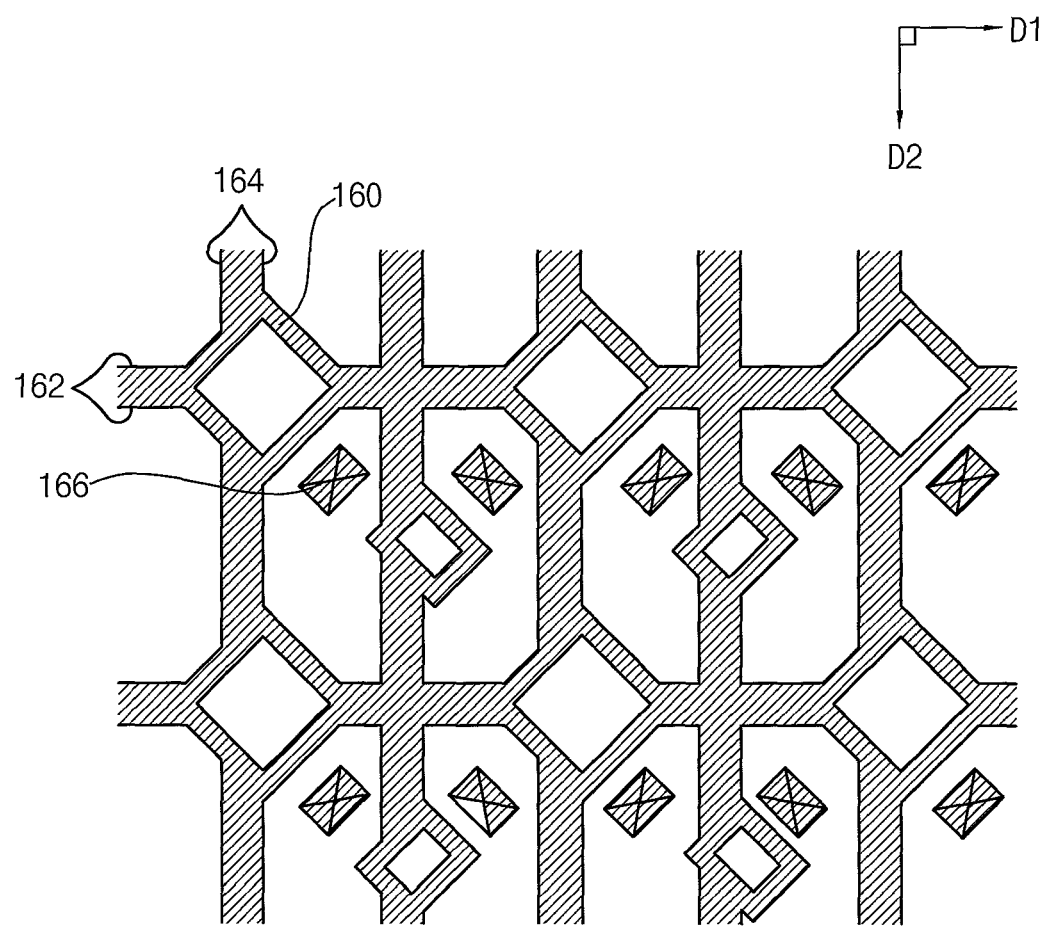
FIG. 6 is a schematic plan view illustrating an arrangement of a second conductive member included in the organic light emitting display device of FIG. 1A.
Figure 7:
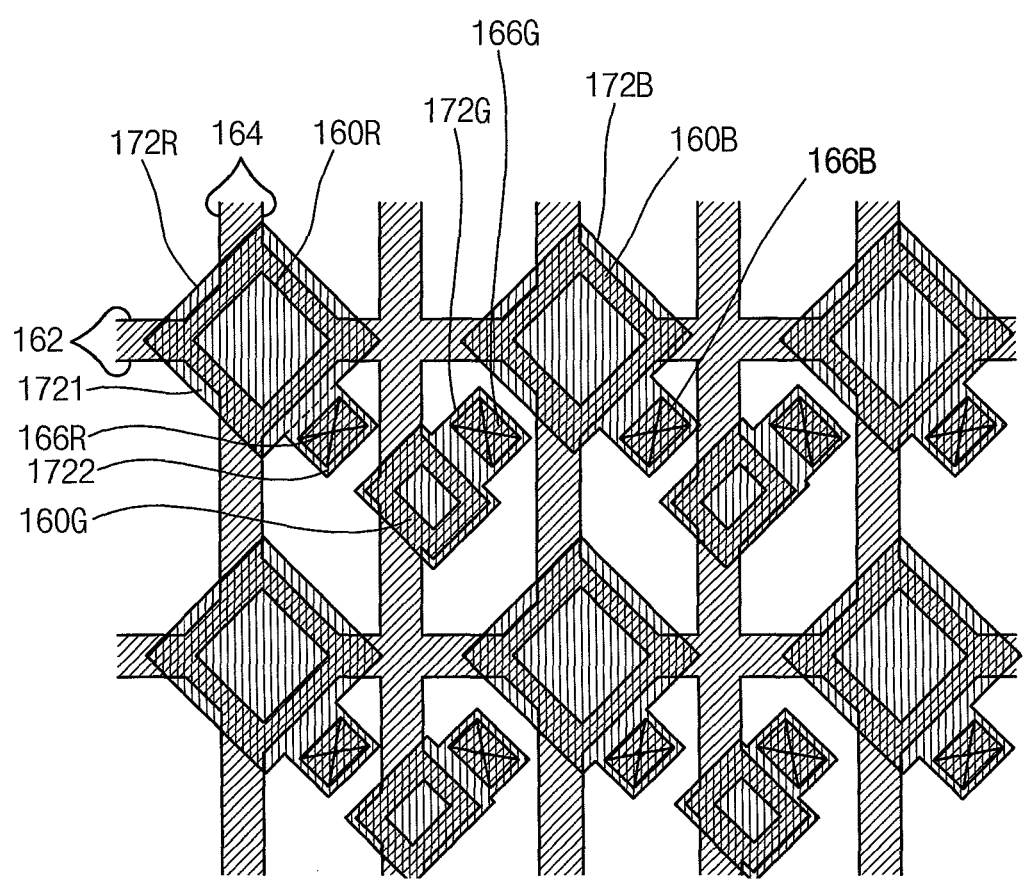
FIG. 7 is a schematic diagram illustrating an arrangement relationship of a second conductive member and a first electrode of a plurality of pixels of the organic light emitting display device of FIG. 1A.

FIG. 6 is a schematic plan view illustrating an arrangement of a second conductive member included in the organic light emitting display device of FIG. 1A. FIG. 7 is a schematic diagram illustrating an arrangement relationship of a second conductive member and a first electrode of a plurality of pixels of the organic light emitting display device of FIG. 1A.

In FIGS. 6 and 7, the same or like reference numerals are used to designate the same or like elements of the organic light emitting display device as those in FIGS. 1A and 2, and any repetitive detailed description thereof may be omitted.

Referring to FIGS. 1A, 1B, 2, 6 and 7, the second conductive member may include a border pattern 160, a first extension pattern 162, a second extension pattern 164 and a contact pattern 166.

In an exemplary embodiment, the border pattern 160 may be arranged with a uniform or constant width along a shape of a border line of the display area DA. The border pattern 160 may be a rim shape according to the shape of the border line. The border pattern 160 may overlap a part of the display area DA and a part of the peripheral area PA. Overlapping portion of the border pattern 160 with the display area DA may correspond to the outer light-emitting area OA. A stepped portion in which the outer light-emitting area OA is higher than the inner light-emitting area IA may be defined or formed by the arrangement of the border pattern 160.

The first extension pattern 162 may extend from the border pattern 160 in a first direction D1 (i.e., a row direction). Thus, border patterns 160 in the same row may be electrically connected through the first extension pattern 162. In one exemplary embodiment, for example, the first extension pattern 162 may be arranged for odd-numbered rows or even-numbered rows.

The second extension pattern 164 may extend from the border pattern in a second direction D2 (i.e., a column direction). The second direction D2 may be substantially perpendicular to the first direction D1. Thus, the border patterns in the same column may be electrically connected through the second extension pattern 164.

In an exemplary embodiment, the border pattern 160, the first extension pattern 162 and the second extension pattern 164 may transmit the driving voltage to each of the pixels. The border pattern 160, the first extension pattern 162 and the second extension pattern 164 may collectively define a lattice structure as illustrated in FIG. 6. The border pattern 160, the first extension pattern 162 and the second extension pattern 164 may transmit the driving voltage with the lower driving voltage, so that a voltage drop of the driving voltage and the luminance unevenness may be effectively reduced or prevented.

The contact pattern 166 may be spaced apart from the border pattern 160, the first extension pattern 162 and the second extension pattern 164, and arranged in the peripheral area PA. In some embodiments, the contact pattern 166 may electrically connect the first electrode of the organic light emitting structure and some thin film transistors of the pixel though a contact hole. Accordingly, a driving current generated from a driving transistor of the pixel may be transmitted to the first electrode through the contact pattern 166.

A planar shape of the contact pattern 166 may be a rectangular shape having sides not parallel to both the first direction D1 and the second direction D2. In one exemplary embodiment, for example, the contact pattern 166 may be a rectangular pattern having sides parallel to one side the display area opposite to the connection pattern 166. Thus, an area of a connected portion of the first electrode for connection with the pixel circuit may be reduced.

In an exemplary embodiment, as illustrated in FIG. 7, each of the pixels R, G and B may include the first electrode 172R, 172G or 172B overlapping a part of the second conductive member. The first electrode 172R, 172G or 172B may be arranged to cover the entire display area DA, the border pattern 160R, 160G or 160B, and the contact pattern 166R, 166G or 166B.

In such an embodiment, the configuration of the green pixel G and the blue pixel B may be substantially the same as that of the red pixel R. Hereinafter, the red pixel R will be described in detail for convenience of description.

In an exemplary embodiment, the first electrode 172R may include a portion 1721 for covering the display area DA and the border pattern 160R and a contact portion 1722 for electrical connection with an underlying pixel circuit. The contact portion 1722 may correspond to an area overlapping the contact pattern 166R. Accordingly, an area of the contact portion 1722 may be reduced and indented portions of the first and second extension patterns 162 and 164 may be eliminated. Thus, the voltage drop of the driving voltage may be decreased.

FIG. 8 is a schematic cross-sectional view taken along line II-IF of FIG. 1B illustrating a portion of an exemplary embodiment of the organic light emitting display device.

In FIG. 8, the same or like reference numerals are used to designate the same or like elements of the organic light emitting display device as those in FIGS. 1A, 1B and 2, and any repetitive detailed description thereof may be omitted.

Referring to FIGS. 1B and 8, an exemplary embodiment of the organic light emitting display device may include: a backplane structure including a substrate 110, a plurality of thin film transistors T, a first conductive member 140 and a second conductive member 160 and 162; and a light emitting structure 170 including a first electrode 172, an organic light emitting layer 174 and a second electrode 176.

The substrate 110 of the backplane structure may be divided into a display area DA having an inner light-emitting area IA and an outer light-emitting area OA1 and OA2 surrounding the inner light-emitting area IA, and a peripheral area PA surrounding the display area DA (i.e., surrounding the outer light-emitting area OA1 and OA2). In such an embodiment, the backplane structure is substantially the same as that shown in FIG. 2, and any repetitive detailed description thereof will be omitted. In some embodiments, configurations including thin film transistors, wiring patterns and the like may be arranged in the outer light-emitting area OA2 and the peripheral area PA in contact therewith.

The second conductive member 160 and 162 including a border pattern 160 and an extension pattern 162 may be disposed on the first via insulation layer 150. The extension pattern 162 may be connected to the border pattern 160 and extend in a first direction D1.

The second via insulation layer 165 may be disposed on the first via insulation layer 150 to cover the second conductive member 160. The second via insulation layer 165 may have a step along a profile of the second via insulation layer 165. Thus, a height of a portion of the second via insulation layer 165 in the outer light-emitting area OA1 and OA2 may become greater than a height of a portion of the second via insulation layer 165 in the inner light-emitting area IA.

In some embodiments, a first outer light-emitting area OA1 and a second outer light-emitting area OA2 may have the same width, height and inclination as each other.

The first electrode 172 may be disposed on the inner and outer light-emitting areas IA, OA1 and OA2 and a part of the peripheral area PA of the second via insulation layer 165. In such an embodiment, a part of the first electrode 172 may overlap at least a part of the second conductive member 160. The first electrode 172 may have a step structure between the inner light-emitting area IA and the outer light-emitting area OA1 and OA2 along a side profile of the second via insulation layer 165. Thus, the height of the outer light-emitting area OA1 and OA2 may become greater than the height of the inner light-emitting area IA.

The display area DA of the light emitting structure 170 having the first electrode 172 may include the inner light-emitting area IA and the outer light-emitting area OA1 and OA2 having the uniform or constant step (i.e., height difference) with respect to the inner light-emitting area IA.

Figure 9:
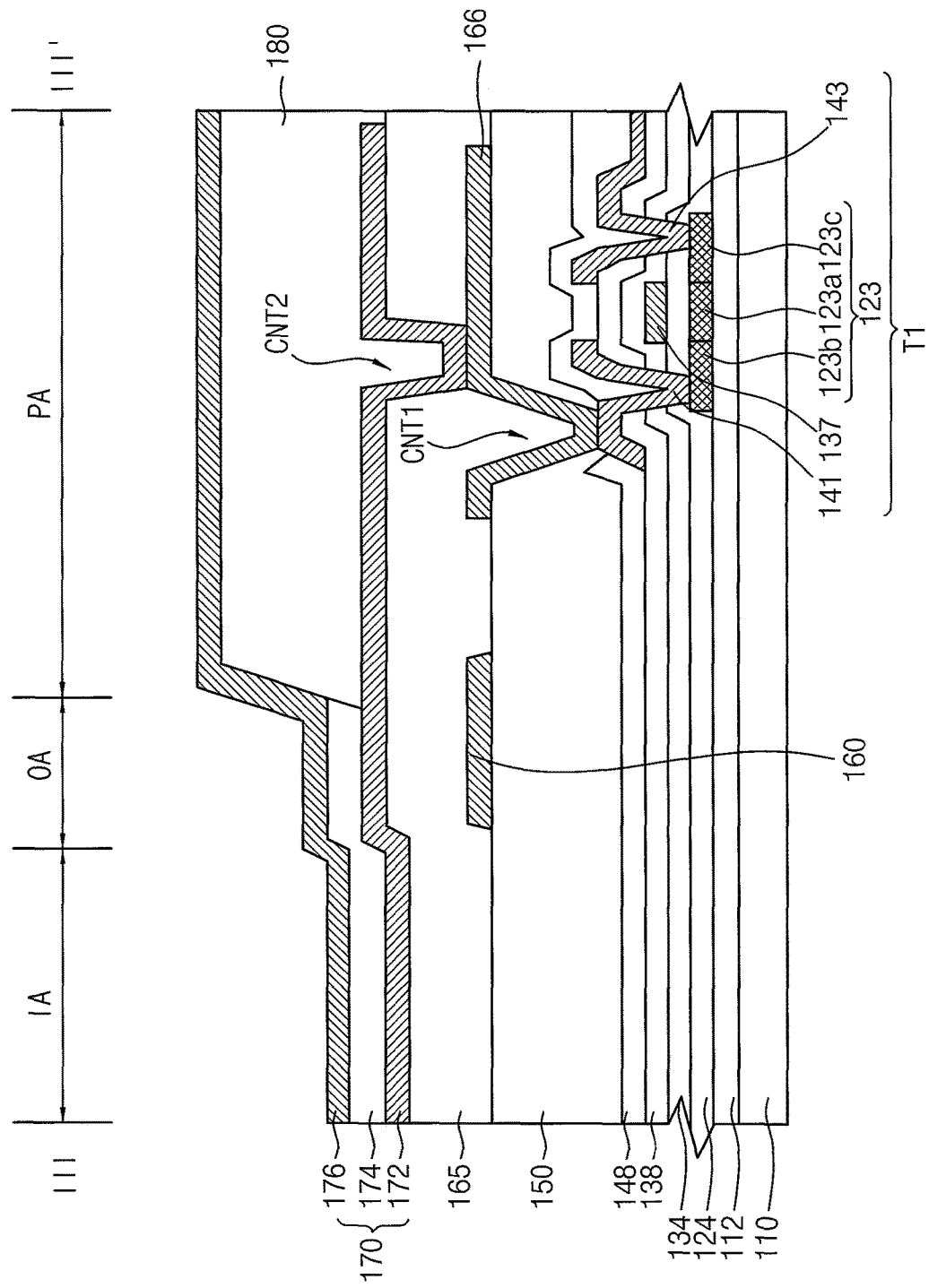
FIG. 9 is a schematic cross-sectional view taken along line III-III' of FIG. 1B illustrating a portion of an exemplary embodiment of the organic light emitting display device.

FIG. 9 is a schematic cross-sectional view taken along line III-III' of FIG. 1B illustrating a portion of an exemplary embodiment of the organic light emitting display device.

In FIG. 9, the same or like reference numerals are used to designate the same or like elements of the organic light emitting display device as those in FIGS. 1A, 1B and 2, and any repetitive detailed description thereof may be omitted.

Referring to FIGS. 1A, 1B and 9, an exemplary embodiment of the organic light emitting display device may include: a backplane structure including a substrate 110, a thin film transistors T1, a first conductive member 140, and a second conductive member 160 and 162; and a light emitting structure 170 including a first electrode 172, an organic light emitting layer 174 and a second electrode 176.

The substrate 110 of the backplane structure may be divided into a display area DA having an inner light-emitting area IA and an outer light-emitting area OA1 and OA2 surrounding the inner light-emitting area IA and a peripheral area PA surrounding the display area DA (i.e., surrounding the outer light-emitting area OA1 and OA2). In such an embodiment, the backplane structure is substantially the same as that shown in FIG. 2, and any repetitive detailed description thereof will be omitted. In some embodiments, the thin film transistor T1 including an active layer 123 having a channel region 123a, source and drain regions 123b and 123c, a gate electrode 137, source and drain electrodes 141 and 143 may be arranged in the peripheral area PA.

In some embodiments, a border pattern 160 of the second conductive member may be disposed on the outer light-emitting area OA and a part of the peripheral area PA of the first via insulation layer 150. A contact pattern 166 of the second conductive member may be disposed on the peripheral area PA of the first via insulation layer 150 and spaced apart from the border pattern 160. The contact pattern 166 may be connected to the thin film transistor T1 through a first contact hole CNT1 defined through the first via insulation layer 150.

The second via insulation layer 165 may be disposed on the first via insulation layer 150 to cover the border pattern 160 and the contact pattern 166. The second via insulation layer 165 may have a step structure along the profile of the second conductive member (the border pattern 160). Accordingly, the height of a portion of the second via insulation layer 165 in the outer light-emitting area OA may be greater than that of a portion of the second via insulation layer 165 in the inner light-emitting area IA.

The first electrode 172 may be disposed on the inner and outer light-emitting areas IA and OA and a part of the peripheral area PA of the second via insulation layer 165. That is, a part of the first electrode 172 may overlap at least a part of the second conductive member in the outer light-emitting area OA. The first electrode 172 may have a step structure between the inner light-emitting area IA and the outer light-emitting area OA along a side profile of the second via insulation layer 165. The first electrode 172 may be connected to the contact pattern 166 via a second contact hole CNT2 defined through the second via insulation layer 165. Thus, the thin film transistor T1 may be electrically connected to the first electrode 172.

Figure 10:
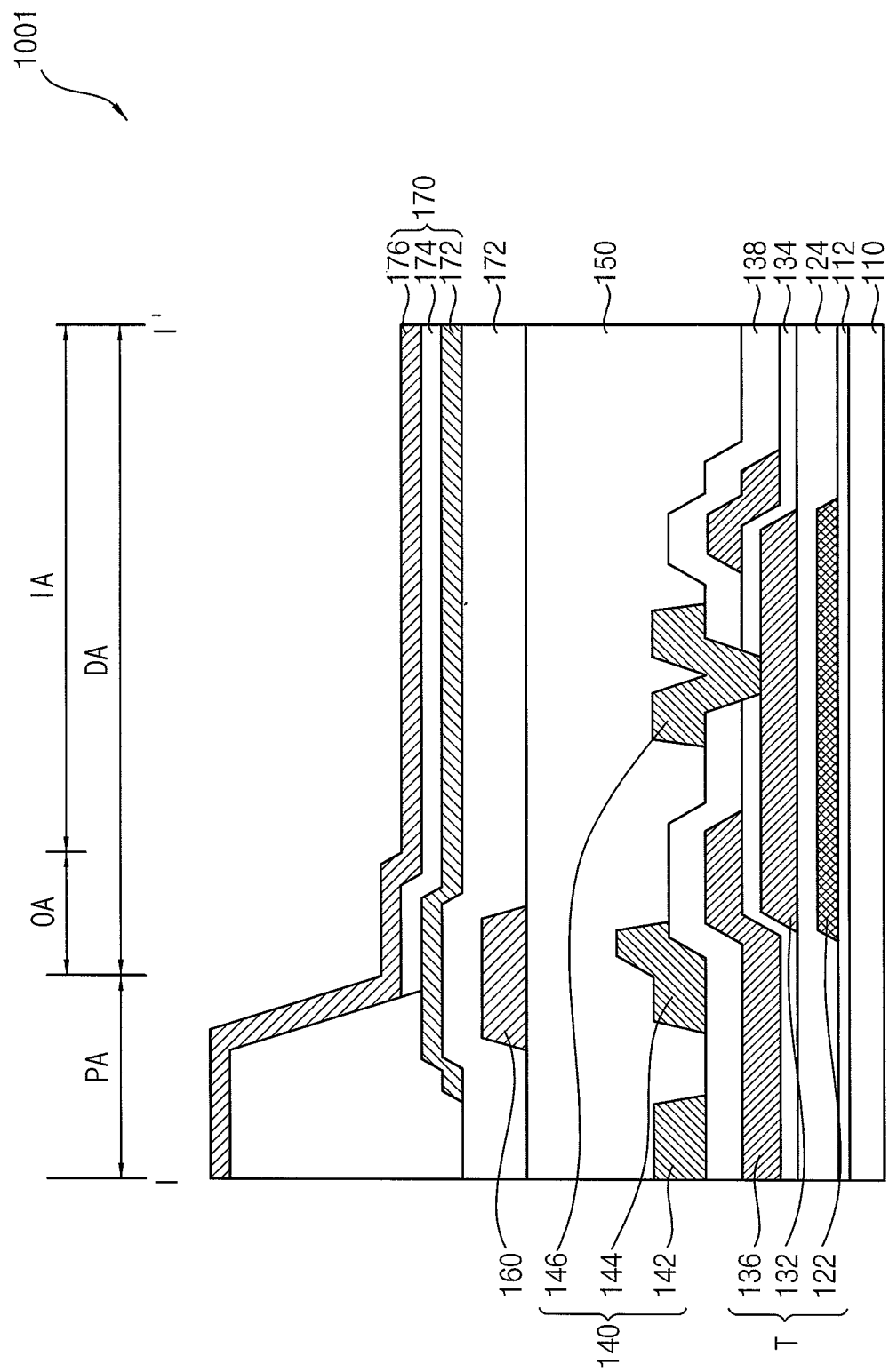
FIG. 10 is a schematic plan view taken along line I-I' of FIG. 1B illustrating a portion of an alternative exemplary embodiment of the organic light emitting display device.

FIG. 10 is a schematic plan view taken along line I-I' of FIG. 1B illustrating a portion of an alternative exemplary embodiment of the organic light emitting display device.

The organic light emitting display device of FIG. 10 is substantially the same as or similar to the organic light emitting display device of FIG. 2 except for the passivation layer. In FIG. 10, the same or like reference numerals are used to designate the same or like elements of the organic light emitting display device as those in FIGS. 1A, 1B and 2, and any repetitive detailed description thereof may be omitted.

Referring to FIG. 10, an exemplary embodiment of the organic light emitting display device 1001 may include: a backplane structure including a substrate 110, a thin film transistors T, a first conductive member 140 and a second conductive member 160; and a light emitting structure 170 including a first electrode 172, an organic light emitting layer 174 and a second electrode 176.

The backplane structure may further include a capacitor, line patterns (e.g., 142, 144, 146), or the like.

In some embodiments, the first via insulation layer 150 may be directly disposed on the second insulating interlayer 138 to cover the first conductive member 140 and the thin film transistor T.

In an exemplary embodiment, the second conductive member 160 (e.g., a border pattern) may be disposed on the outer light-emitting area OA and a part of the peripheral area PA of the first via insulation layer 150. The second conductive member 160 may provide the driving voltage to the pixel. The second via insulation layer 165 may be disposed on the first via insulation layer 150 to cover the second conductive member 160. The second via insulation layer 165 may have a step structure between the inner light-emitting area IA and the outer light-emitting area OA by the arrangement of the second conductive member 160.

Thus, the display area DA of the light emitting structure 170 including the first electrode 172 may be divided into the inner light-emitting area IA and the outer light-emitting area OA having a uniform stepped portion with respect to the inner light-emitting area IA.

Figure 11:
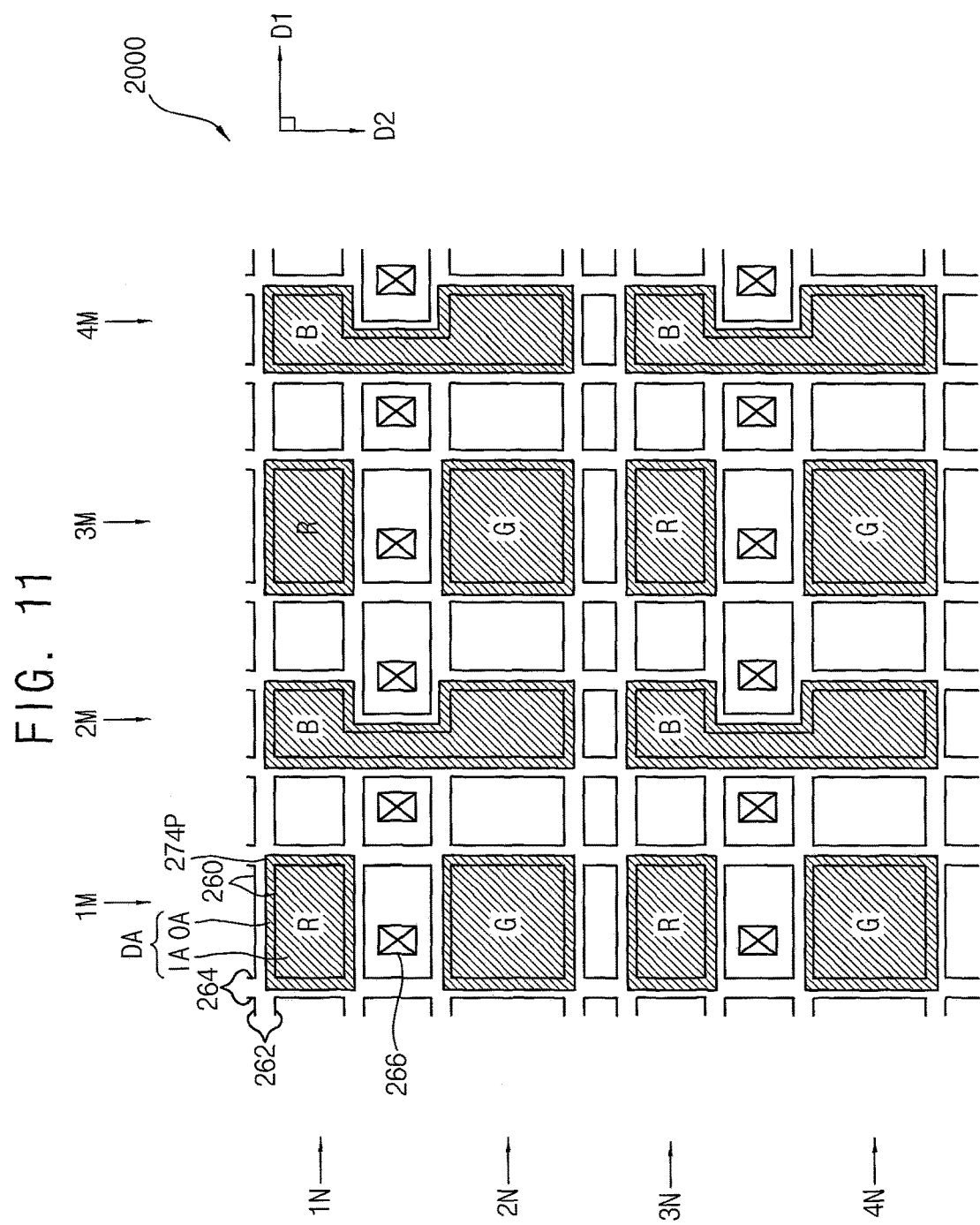
FIG. 11 is a schematic plan view of an organic light emitting display device according to an alternative exemplary embodiment.

FIG. 11 is a schematic plan view of an organic light emitting display device according to an alternative exemplary embodiment. FIG. 12 is a schematic plan view illustrating an arrangement of a second conductive member included in the organic light emitting display device of FIG. 11.

Referring to FIGS. 11 and 12, an exemplary embodiment of the organic light emitting display device 2000 may include a plurality of signal lines (conductive member) and a plurality of pixels R, G and B connected to the signal lines and arranged in a matrix form.

In such an embodiment, the organic light emitting display device 2000 may include a display area DA, on which an image is displayed by an organic light emitting layer pattern 274P, and a peripheral area (a portion other than DA, i.e., PA) surrounding the display area DA.

The pixels R, G and B may include first to third pixels. In some embodiments, the first to third pixels may correspond to a red pixel R, a green pixel G and a blue pixel B, respectively.

In such an embodiment, as illustrated in FIG. 11, the red pixel R and the blue pixel B may be arranged alternately in a first direction D1 in a first row 1N, and the green pixel G and the blue pixel B may be arranged alternately in the first direction D1 in a second row 2N adjacent to the first row 1N. The blue pixel B may be arranged over the first row 1N and the second row 2N. Such pixel arrangement may be repeated up to predetermined rows.

The red pixel R and the green pixel G may be arranged alternately in a second direction D2 in a first column 1M, and the blue pixel B may be arranged and spaced apart from each other in the second direction D2 in a second column 2M. Such pixel arrangement may be repeated up to predetermined columns.

Such a pixel arrangement structure may be a stripe arrangement.

The conductive member 260, 262, 264 and 266 of FIGS. 11 and 12 may be signal lines for transmitting a driving voltage to the pixels R, G and B and/or a connection lines for connecting thin film transistors and an organic light emitting diode in each of the pixels R, G and B. The driving voltage may be a high potential voltage for driving the pixels R, G and B.

In some embodiments, the conductive member may include a border pattern 260 arranged with a uniform width along a border line of the display area DA (e.g., side boundaries of the organic light emitting layer pattern 274P). The display area DA may be divided into an inner light-emitting area IA and an outer light-emitting area OA surrounding the inner light-emitting area IA based on the arrangement of the border pattern 260. In some embodiments, the border pattern 260 and the outer light-emitting area OA may have uniform widths, respectively. The outer light-emitting area OA and the inner light-emitting area IA may have a substantially uniform step (or height difference) with respect to the inner light-emitting area IA based on the border pattern 260. In some embodiments, the outer light-emitting area OA may protrude from the inner light-emitting area IA. In one exemplary embodiment, for example, the outer light-emitting area OA may protrude about 0.5 μm from the inner light emitting area IA.

The conductive member may further include a first extension pattern 262 extending in the first direction D1 to electrically connect between adjacent border patterns 260 in a same row. The conductive member may further include a second extension pattern 264 extending in the second direction D2 perpendicular to the first direction D1 to electrically connect between adjacent border patterns 260 in a same column.

The border pattern 260, the first extension pattern 262 and the second extension pattern 264 may collectively define a lattice structure as illustrated in FIG. 11.

The conductive member may further include a contact pattern 266. The contact pattern 266 may be spaced apart from the display area DA. The contact pattern 266 may be spaced apart from the first and second extension patterns 262 and 264 and disposed in the peripheral area PA.

In an exemplary embodiment, as described above, the organic light emitting display device 2000 may include the display area DA divided into the inner light-emitting area IA and the outer light-emitting area OA having the uniform step with respect to the inner light-emitting area IA. Thus, the emitted (or reflected) lights from the first electrode may change with substantially uniform angle according to the viewing angle, and the WAD characteristic that varies irregularly according to the viewing angle and the viewing position of the user may be improved to be uniform.

Such an embodiment may be applied to any organic light emitting display device and any system including the organic light emitting display device. Such an embodiment of the organic light emitting display device may be applied to a television, a computer monitor, a laptop, a digital camera, a cellular phone, a smart phone, a smart pad, a personal digital assistant ("PDA"), a portable multimedia player ("PMP"), a MP3 player, a navigation system, a game console or a video phone, for example. Such an embodiment may be also applied to a head up display, a wearable display, etc.

The foregoing is illustrative of exemplary embodiments, and is not to be construed as limiting thereof. Although a few exemplary embodiments have been described, those skilled in the art will readily appreciate that many modifications are possible in the exemplary embodiments without materially departing from the novel teachings and advantages of exemplary embodiments. Accordingly, all such modifications are intended to be included within the scope of exemplary embodiments as defined in the claims. In the claims, means-plus-function clauses are intended to cover the structures described herein as performing the recited function and not only structural equivalents but also equivalent structures. Therefore, it is to be understood that the foregoing is illustrative of exemplary embodiments and is not to be construed as limited to the specific embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. An organic light emitting display device, comprising:
   a substrate on which a display area including an inner light-emitting area and an outer light-emitting area surrounding the inner light-emitting area, and a peripheral area surrounding the display area are defined;
   a plurality of thin film transistors on the substrate;
   a first conductive member connected to at least one of the thin film transistors;
   a first via insulation layer on the substrate to cover the first conductive member and the thin film transistors;
   a second conductive member on the first via insulation layer, wherein the second conductive member overlaps the outer light-emitting area and a part of the peripheral area when viewed from a plan view in a thickness direction of the substrate;
   a second via insulation layer on the first via insulation layer to cover the second conductive member, wherein the second via insulation layer has a step structure between the inner light-emitting area and the outer light-emitting area;
a first electrode on the second via insulation layer, wherein the first electrode overlaps the outer light-emitting area and a part of the peripheral area when viewed from the plan view, and the first insulation layer has a step structure between the inner light-emitting area and the outer light-emitting area;
an organic light emitting layer on the first electrode in a pattern of the display area; and
a second electrode on the organic light emitting layer.

2. The device of claim 1, wherein
a height of a portion of the second via insulation layer in the outer light-emitting area is greater than a height of a portion of the second via insulation layer in the inner light-emitting area, and
a height of a portion of the first electrode in the outer light-emitting area is greater than a height of a portion of the first electrode in the inner light-emitting area.

3. The device of claim 2, wherein
a part of the first electrode and a part of the organic light emitting layer overlap at least a part of the second conductive member in the outer light-emitting area.

4. The device of claim 2, further comprising:
a passivation layer between the first conductive member and the first via insulation layer to cover the first conductive member and the thin film transistors.

5. The device of claim 4, wherein
the passivation layer comprises an inorganic material, and each of the first via insulation layer and the second via insulation layer comprises an organic material.

6. The device of claim 2, wherein the second conductive member comprises:
a border pattern arranged with a uniform width along a border line of the display area;
a first extension pattern extending in a first direction in the peripheral area to electrically connect between adjacent border patterns in a same row; and
a second extension pattern extending in a second direction perpendicular to the first direction in the peripheral area to electrically connect between adjacent border patterns in a same column.

7. The device of claim 6, wherein the second conductive member further comprises:
a contact pattern spaced apart from the first extension pattern and the second extension pattern in the peripheral area to be electrically connected to the first electrode through the at least one of the thin film transistors.

8. The device of claim 7, wherein a planar shape of the contact pattern when viewed from the plan view is a rectangular shape having sides not parallel to both the first direction and the second direction.

9. The device of claim 2, wherein a first thickness, which is a thickness of the portion of the second via insulation layer in the outer light-emitting area, is different from a second thickness, which is a thickness of the portion of the second via insulation layer in the inner insulation layer.

10. The device of claim 9, wherein the first thickness is greater than the second thickness.

11. The device of claim 9, wherein the first thickness is less than the second thickness.

12. The device of claim 2, wherein a first thickness, which is a thickness of the portion of the second via insulation layer in the outer light-emitting area, is substantially the same as a second thickness, which is a thickness of the portion of the second via insulation layer in the inner insulation layer.

13. The device of claim 2, wherein the outer light-emitting area is in a rim shape with a uniform width along a border line of the display area corresponding to an arrangement of the second conductive member.

14. The device of claim 2, wherein the first conductive member comprises:
a data line pattern which transmits a data voltage;
a driving voltage line pattern which transmits a driving voltage; and
a contact pattern electrically connected to the thin film transistors, the data line pattern, and the driving voltage line pattern.

15. The device of claim 14, wherein the second conductive member transmits the driving voltage.

16. The device of claim 15, wherein at least a part of the second conductive member overlaps the driving voltage line pattern when viewed from the plan view.

17. An organic light emitting display device, comprising:
a backplane substrate divided into a display area including an inner light-emitting area and an outer light-emitting area surrounding the inner light-emitting area, and a peripheral area surrounding the display area;
a first electrode on the inner light-emitting area and the outer light emitting area of the backplane substrate and a part of the peripheral area of the backplane substrate, wherein the first electrode has a step structure between the inner light-emitting area and the outer light-emitting area;
an organic light emitting layer on the first electrode in a pattern of the display area; and
a second electrode on the organic light emitting layer.

18. The device of claim 17, wherein the backplane substrate comprises:
a substrate;
a plurality of thin film transistors on the substrate;
a first conductive member electrically connected to at least one of the thin film transistors;
a first via insulation layer covering the first conductive member and the thin film transistors;
a second conductive member on a portion of the first via insulation layer in the outer light-emitting area and a part of a portion of the first via insulation layer in the peripheral area; and
a second via insulation layer on the first via insulation layer to cover the second conductive member, wherein the second via insulation layer has a step structure between the inner light-emitting area and the outer light-emitting area.

19. The device of claim 18, wherein
a height of a portion of the second via insulation layer in the outer light-emitting area is greater than a height of a portion of the second via insulation layer in the inner light-emitting area, and
a height of a portion of the first electrode in the outer light-emitting area is greater than a height of a portion of the first electrode in the inner light-emitting area.

20. The device of claim 18, wherein the second conductive member comprises a border pattern arranged with a uniform width along a border line of the display area.

* * * * *